United States Patent
Fukunaka (12)

(10) Patent No.: US 6,724,059 B2
(45) Date of Patent: Apr. 20, 2004

(54) MAGNETOELECTRIC TRANSDUCER AND METHOD FOR PRODUCING THE SAME

(75) Inventor: Toshiaki Fukunaka, Nobeoka (JP)

(73) Assignee: Asahi Kasei Electronics Co., Ltd., Tokyo (JP)

( * ) Notice: Subject to any disclaimer, the term of this patent is extended or adjusted under 35 U.S.C. 154(b) by 78 days.

(21) Appl. No.: 09/980,873

(22) PCT Filed: Apr. 5, 2001

(86) PCT No.: PCT/JP01/02962
§ 371 (c)(1),
(2), (4) Date: Dec. 6, 2001

(87) PCT Pub. No.: WO01/78161
PCT Pub. Date: Oct. 18, 2001

(65) Prior Publication Data
US 2002/0160548 A1 Oct. 31, 2002

(30) Foreign Application Priority Data
Apr. 6, 2000 (JP) .......................................... 2000-105450

(51) Int. Cl.[7] ............................................... H01L 43/00
(52) U.S. Cl. ........................ 257/427; 257/421; 257/423; 438/77
(58) Field of Search ................................. 257/421–427; 438/77

(56) References Cited

U.S. PATENT DOCUMENTS 4,978,938 A * 12/1990 Partin et al. ............... 338/32 R

FOREIGN PATENT DOCUMENTS

| JP | 5-304325 | | 11/1993 | |
|---|---|---|---|---|
| JP | 10-227845 | | 8/1998 | |
| JP | 10227845 A | * | 8/1998 | ........... H01L/43/02 |
| JP | 2000-12919 | | 1/2000 | |
| JP | 2000012919 A | * | 1/2000 | ........... H01L/43/04 |
| JP | 2000-101162 | | 4/2000 | |
| JP | 2000-150983 | | 5/2000 | |

OTHER PUBLICATIONS

IBM Technical Disclosure Bulletin, Nov. 1972. vol. 15, Issue 6, pp. 1977–1980 "Packaging of Integrated Circuits".*

* cited by examiner

Primary Examiner—Scott R. Wilson
(74) Attorney, Agent, or Firm—Finnegan, Henderson, Farabow, Garrett & Dunner, LLP

(57) ABSTRACT

The present invention provides a thin magnetoelectric transducer which has a projected size substantially equal to that of a pellet and which can be subjected to an inspection test nondestructively. The magnetoelectric transducer has a semiconductor device provided on the upper surface of a projecting portion of a projecting nonmagnetic insulating substrate 9 and comprising a magnetosensitive section 3 and inner electrodes 2 made of metal. A conductive resin layer 4 is formed on the internal electrodes 2 and on part of the side surfaces of the projecting portion. A strain buffering layer 5 is formed at least on the magnetosensitive section 3. Furthermore, at least the strain buffering layer 5 on the magnetosensitive section 3 is coated with a protective layer 6.

9 Claims, 4 Drawing Sheets

MAGNETOELECTRIC TRANSDUCER AND METHOD FOR PRODUCING THE SAME

DESCRIPTION

1. Technical Field

The present invention relates to a very thin magnetoelectric transducer, and more specifically, to a small magnetoelectric transducer which allows the correctness of its mounting to be determined without being destroyed and that allows magnetoelectric transducers to be easily formed.

Furthermore, the present invention relates to a method for producing a very thin magnetoelectric transducer, and more specifically, to a method for producing a small magnetoelectric transducer which allows the correctness of its mounting to be determined nondestructively and that allows magnetoelectric transducers to be easily formed.

2. Background Art

Hall elements, which are among the magnetoelectric transducers, are widely used as rotational position sensors for drive motors for VTRs, flexible disks, CD-ROMs, and the like or as potentiometers or gear sensors. Owing to the trend to reduce the sizes of these electronics, there is a growing demand for a reduction in the thickness of Hall elements.

The current common Hall elements are produced as follows: First, a magnetoelectric transducer is constructed that is composed of a thin semiconductor film that has internal electrodes and that senses magnetism. Then, the magnetoelectric transducer is secured to a portion call an "island portion" of a lead frame, and the lead frame and the inner electrodes are connected together with metal wires. Then, a portion of the lead frame which covers the magnetoelectric transducer is molded using a resin. Subsequently, steps including deburring, lead formation, and electromagnetic inspections are executed.

FIGS. 7A and 7B show the appearance of the relatively small element described above as an example of an element produced in the above manner. FIGS. 7A and 7B are a side view and a plan view, respectively. This element has a height h of 0.8 mm and a width w of 1.25 mm. The length L and width W of this element, including a lead frame, are each 2.1 mm.

The smallest commercially available Hall elements, including a lead frame that functions as an external electrode after mounting, have outside dimensions including a height of 0.6 mm on a projected area of 2.5×1.5 mm or a height of 0.55 mm on a projected area of 2.1×2.1 mm. These elements are characterized by their small height.

To further reduce the size of the element, a tape carrier method that uses no intervening lead frames has been proposed. This method comprises connecting the electrode portion of the magnetoelectric transducer to a tape via bumps to mount it on a substrate. This method is still limited by the thickness of the tape.

The present invention is provided in view of these problems, and it is an object thereof to provide a very thin magnetoelectric transducer that allows the correctness of its mounting to be determined nondestructively, as well as a production method therefor.

It is another object of the present invention to provide a magnetoelectric transducer that allows a magnetoelectric transducer to be easily formed and that is of a pellet size, that is, has a size substantially equal to that of a pellet, as well as a production method therefor.

DESCRIPTION OF THE INVENTION

After wholehearted examinations, the inventors have concluded that notably the size and thickness reductions on the projected area are limited as long as a lead frame such as the one described previously is used. Even if the magnetoelectric transducer has a mold size of about 1.5×1.5 mm, lead frames projecting from the element must be formed so as to be suited for mounting. Thus, these projecting parts pose a problem. Further, since the reduction of the thickness of the lead frames is limited and the front and back sides of the lead frames must be covered with a mold resin, the reduction of the height is limited.

The present invention is based on this conclusion, and makes the size of the entire magnetoelectric transducer, including mounted electrodes, substantially equal to the mold size.

That is, a magnetoelectric transducer according to the present invention is characterized in that the element comprises a magnetosensitive section and internal electrodes formed on an upper surface of any insulating substrate having conductive layers formed on side surfaces thereof, an insulating portion and each of the conductive layers are formed of a sintered compact, the sintered compact of the conductive layer is mainly composed of metal of a high melting point of 1,600° C. or higher and ceramic powders, and the sintered compact of the conductive layer contains 10% to 90% of the high-melting-point metal.

Further, the magnetoelectric transducer according to the present invention is characterized in that the high-melting-point metal is W, Mo, Ta, or a mixture thereof, and the sintered compact of the insulating layer is a substrate composed of alumina.

Furthermore, the magnetoelectric transducer according to the present invention is characterized in that an adhesive resin layer or an inorganic layer is formed on a upper surface of the insulating substrate, and the magnetosensitive layer and each of the internal electrodes are formed thereon.

Moreover, the magnetoelectric transducer according to the present invention is characterized in that the sintered compact of the conductive layer and each internal electrode, separated from each other at least via a step of the adhesive resin layer or the inorganic layer, are electrically connected together using a conductive resin or a metal material.

Further, the magnetoelectric transducer according to the present invention is characterized in that an inorganic layer is formed on the upper surface of the insulating substrate, and an InSb-based thin film having an electron mobility of 10,000 cm$^2$/V/sec. or more is formed on the inorganic layer. The inorganic layer may be made of silica, alumina, or glass.

Furthermore, the magnetoelectric transducer according to the present invention is characterized in that a resin layer is formed on the upper surface of the insulating substrate, and an InSb-based thin film having an electron mobility of 20,000 cm$^2$/V/sec. or more is formed thereon.

Moreover, the magnetoelectric transducer according to the present invention is characterized in that a metal coat is formed at least on a surface of the sintered compact of the conductive layer.

Further, the magnetoelectric transducer according to the present invention is characterized in that a strain buffering layer is formed on the magnetosensitive section, and a protective film is formed thereon.

Furthermore, a method for producing a magnetoelectric transducer according to the present invention is characterized by comprising the steps of forming a thin film that senses magnetism, on a surface of an insulating substrate via an insulating layer, the substrate having a conductive layer formed therein and mainly composed of a high-melting-point metal layer and ceramic powders in a thickness direction of the substrate, a sintered compact of each of the conductive layers containing 10% or more to 90% of the high-melting-point metal; forming a large number of magnetosensitive sections and internal electrodes of metal on the thin film in a pattern of final elements to collectively form a large number of magnetoelectric transducers; cutting the insulating layer on the conductive layer of the substrate; electrically connecting the internal electrodes and conductive layers of each of the magnetoelectric transducers together; forming a protective layer at least on the magnetosensitive section; and cutting a central portion of each of the conductive layers of the substrate to individualize a large number of magnetoelectric transducers.

Moreover, a method for producing a magnetoelectric transducer according to the present invention is characterized by comprising the steps of forming a thin film that senses magnetism, on a surface of an insulating substrate via an insulating layer, the substrate having a conductive layer formed therein and mainly composed of a high-melting-point metal layer and ceramic powders in a thickness direction of the substrate, a sintered compact of each of the conductive layers containing 10% to 90% of the high-melting-point metal; forming a large number of magnetosensitive sections and internal electrodes of metal on the thin film in a pattern of final elements to collectively form a large number of magnetoelectric transducers; etching the insulating layer on the conductive layers of the substrate; electrically connecting the internal electrodes and conductive layers of each of the magnetoelectric transducers together; forming a protective layer at least on the magnetosensitive section; and cutting a central portion of each of the conductive layers of the substrate to individualize a large number of magnetoelectric transducers.

Further, a method for producing a magnetoelectric transducer according to the present invention is characterized by comprising the steps of forming an insulating layer on that part of a surface of an insulating substrate which is different from surfaces of conductive layers formed in the substrate and mainly composed of a high-melting-point metal layer and ceramic powders in a thickness direction of the substrate, a sintered compact of each of the conductive layers containing 10% to 90% or less of the high-melting-point metal; forming a thin film that senses magnetism, on said insulating layer; forming a large number of magnetosensitive sections and internal electrodes of metal on the thin film in a pattern of final elements to collectively form a large number of magnetoelectric transducers; electrically connecting the internal electrodes and conductive layers of each of the magnetoelectric transducers together; forming a protective layer at least on the magnetosensitive section; and cutting a central portion of each of the conductive layers of the substrate to individualize a large number of magnetoelectric transducers.

Furthermore, the method for producing a magnetoelectric transducer according to the present invention is characterized by further comprising the step of coating metal suited for soldering, at least on the conductive layers of the magnetoelectric transducer which are exposed by cutting.

With the above configuration, a very small and thin magnetoelectric transducer having, for example, a height of 0.35 mm on a projected area of 0.8×1.55 mm can be achieved by a simple method.

For a Hall element, which is an example of the magnetoelectric transducer of the present invention, the thin film constituting the magnetoelectric transducer and sensing magnetism can be selected from a group comprising thin compound semiconductor films of indium antimony, gallium arsenic, indium arsenic, and the like or thin three- and four-element compound semiconductor films of (indium, gallium)-(antimony, arsenic). What is called a quantization effect element can also be used. These thin compound semiconductor films are formed on an insulating substrate having conductive layers formed in the thickness direction thereof. The thin compound semiconductor film may be formed on an inorganic layer previously formed on the insulating substrate. Alternatively, a mask is applied to the conductive layers of the insulating substrate to form an inorganic layer, and the thin compound semiconductor film is then formed thereon. In this case, the thin compound semiconductor film is formed directly on the masked conductive layer.

A more sensitive Hall element may be obtained by forming a thin film on a high crystalline substrate by vapor deposition and transferring the thin film to the above-described substrate via a resin. The inventors have proposed various vapor deposition processes for increasing the mobility of indium antimony, that is, its sensitivity, and a thin film produced by these methods is preferably applicable to the present invention (refer to Japanese Patent Application Publication Nos. 1-13211, 1-15135, 2-47849, and 3-59571).

Elements other than the Hall elements include, for example, magnetoresistive elements of ferromagnetic substance, GMRs, and semiconductor magnetroresistive elements. Films for GMRs and magnetroresistive elements of ferromagnetic substance may comprise a ferromagnetic material such as Ni—Fe or Ni—Co. Further, for semiconductor resistance elements, the above-described compound semiconductor can be used.

BRIEF DESCRIPTION OF THE DRAWINGS

FIG. 1A shows that a protective layer is formed on a strain buffering layer and on part of each internal electrode. FIG. 1B shows that a protective layer is formed all over a surface of a substrate.

FIG. 2B is a partially enlarged view of FIG. 2A.

FIG. 7A is a side view, and FIG. 7B is a plan view.

BEST MODE FOR CARRYING OUT THE INVENTION

Figure 1A:
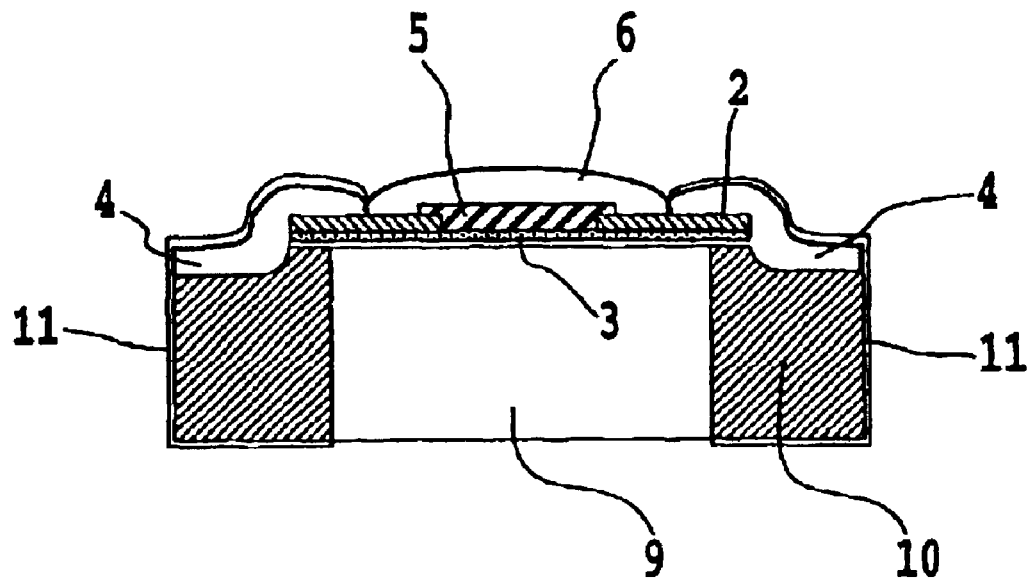
FIGS. 1A and 1B are schematic sectional views of an embodiment of a Hall element according to the present invention.

In general, a large number of magnetoelectric transducers are simultaneously formed on-a substrate through a multi-step process. To allow these magnetoelectric transducers to be used as magnetoelectric transducers, for example, Hall elements, four internal electrodes are commonly formed on a single element. An important point of the present invention is that no wire made of metal such as gold is provided in these internal electrodes so that the internal electrodes can be connected directly to external electrodes.

First, a substrate is provided which is formed of sintered compacts of conductive layers embedded in the thickness direction of the substrate in portions of the substrate which correspond to the side surfaces of the elements, and of a sintered compact of an insulating portion.

The insulating substrate having the conductive layers formed in its thickness direction may be, for example, an alumina substrate having conductors composed of high-melting-point metal such as W, Mo, or Ta and sintered compacts mainly composed of ceramic powders, the conductors and the sintered compacts being locally embedded in the substrate. This is produced using the following steps: Ninety percent of alumina, a binder, and the like are mixed together, and the mixture is molded into a sheet of the desired thickness using a doctor blade process. The sheet is then dried. Then, the sheet is locally blanked using a blanking die, and a paste composed of a mixture of W, alumina powders, and a binder is embedded in the blanked portions. In the present invention, these embedded portions will be side and back surface electrode portions of magnetoelectric transducers. Subsequently, the W paste is printed in the desired portions of the front and back surfaces of the substrate by screen printing or the like as required. In the present invention, this is effective in forming a large back surface electrode portion of an external electrode portion of the magnetoelectric transducer. Then, the sheet is baked in a reducing atmosphere up to 1,600° C. to complete an alumina substrate (metallized alumina substrate) having the sintered compacts embedded in the thickness direction and composed of W as conductors. In this case, since a large number of conductive layers are formed in the substrate, cracking or warpage is prone to occur in the substrate during baking because of a difference in the contraction factor between the high-melting-point metal and alumina. To restrain this, the sintered compacts of the conductive layers preferably contain 10% or more and 90% or less of W, high-melting-point metal. The use of this substrate is preferable in producing magnetoelectric transducers that sufficiently resist heat, that are rigid, and that smoothly conduct heat therethrough.

Next, a large number of magnetoelectric transducers and internal electrodes are formed on the substrate as described above. At this time, the etching step of patterning magnetosensitive sections is carried out before or after the formation of the internal electrodes. The material of the internal electrodes may be metal such as Al, Cu, Pd, Cr, Ti, or the like. The internal electrodes may be formed by plating, vapor deposition, or the like. Among these methods, Cu plating is preferably used owing to its resulting conductivity and low formation costs.

Next, a strain buffering layer is preferably formed at least on the magnetosensitive section. At this time, a photosensitive resin can be used easily. Using, for example, solder resist or photosensitive polyimide, the strain buffering layer can be precisely formed by an exposure and development process using an ordinary mask. In this case, it is essential to form a strain buffering layer so that it has a uniform film thickness of 1 to 60 $\mu$m, preferably about 30 $\mu$m, and for example, a spin coat process can be preferably used to form this layer. Further, in this or preceding stage, what is called a passivation layer may be formed in order to improve reliability, by laminating an inorganic insulator such as a metal oxide, glass, or alumina at least on the magnetosensitive section.

Then, the step of exposing the conductive layers of the insulating substrate is carried out. This step can be more easily achieved by cutting the substrate by dicing. In this case, the cuts need not necessarily be made in both the X and Y directions but may be made only in the X direction. Alternatively, using a photolithography approach, the conductive layer maybe exposed by etching. Additionally, if the conductive layer is masked, while an insulating layer is formed on the other portions, then this step is not required.

The present invention is also characterized in that the pattern of the internal electrodes is connected directly to external electrodes. To achieve this, a conductive resin layer or a metal layer is formed in order to electrically connect the conductive-layer sintered compacts and internal electrodes of the insulating substrate, which are separated from each other at least via the step of the insulating layer. For example, a conductive resin may be printed on a wafer, or a metal layer may be imparted to the wafer by vapor deposition, sputtering, or the like using a lift-off process. At this time, the conductive resin layer or metal layer is more preferably formed so as to extend across the internal electrodes of adjacent elements. If the wafer is cut by dicing and the conductive resin is printed on the wafer, the conductive resin layer is formed at least on a portion of a side surface of the cut portion which joins to the upper surface of the substrate. The conductive resin layer is formed down to at least 0.1 mm from the upper surface. The conductive resin layer is formed to have a thickness of 0.02 mm or larger. If this thickness is smaller than 0.02 mm, the following problems occur: That is, if an element is to be completed such that part of the conductive resin layer is exposed from a protective film, the electrode portion is formed by soldering when this element is mounted on the substrate. However, in this case, the conductive material may be attacked by molten solder, leading to an open circuit.

If the conductive resin contains a conductive material such as flaked Ag, granular Cu, or Ag-plated granular Cu, Au, Ag, or Cu is preferably formed on the exposed conductive-layer sintered compact of the substrate by plating or the like. This is effective in improving the wettability for the conductive resin to obtain firmer junctions.

Then, a protective layer is formed at least on the strain buffering layer on the magnetosensitive section. At this time, the protective layer may also be formed on part of the cut portion, part of the etched portion, part of the internal electrode, or part of the conductive resin. Alternatively, the protective layer may be formed all over the surface on which the magnetosensitive section is formed. Alternatively, a larger strain buffering layer may be formed so that the protective layer can be formed on that part of the strain buffering layer which covers the magnetosensitive section. The protective layer may be selected from a group comprising thermosetting resins such as an epoxy resin, a polyimide resin, and an imide modified epoxy resin, and thermoplastic resins such as a phenoxy resin, a polyamide resin, polystyrene, polysulfone, a polyurethane resin, and a polyvinyl acetate resin. The protective layer may be formed by potting, screen printing, transfer mold, or the like, but a screen printing process using a metal or silk mask may preferably be used in order to form a thin protective layer having a thickness of about 30 to 100 µm. In this case, if the strain buffering layer is not used, the resin as the protective layer is hardened and contracted to strain the magnetosensitive section. Consequently, before and after this step, an electromagnetic property of a Hall element such as I/O resistance, unbalanced voltage, or output voltage in the presence of magnetic fields varies significantly, thereby drastically reducing yield to 30% or less. The strain buffering layer is required to prevent the magnetosensitive section from being affected by strain resulting from the hardening and contraction of the resin. The strain buffering layer thus serves to increase the yield. If a firm passivation layer such as the one described previously is formed on the magnetosensitive section, the strain buffering layer is not required.

Then, a central portion of each conductive layer as viewed from the front surface of the insulating substrate described previously is cut down to the back surface of the substrate by dicing or the like, to obtain individual elements. At this time, the conductive layer is preferably cut using a blade that is thinner than the blade already used for cutting. The conductive resin or metal and the sintered compact of the conductive layer in the substrate are joined together over a distance corresponding to half of a difference in the thickness between these two blades.

Then, barrel plating is carried out to coat metal suited for soldering on the conductive resin layer of the magnetoelectric transducer, the sintered compact of the conductive layer exposed by cutting, and the sintered compact of the conductive layer on the back surface, that is, the exposed sintered compact of the conductive layer. This coating operation can be preformed by either electroplating or electroless plating.

The present invention is thus characterized in that the entire substrate can be collectively processed and very easily formed into elements. Thus, in the magnetoelectric transducer of the present invention, at least the conductive layers of the insulating substrate are connected to the external electrodes, so that the correctness of the mounting of the element on the substrate or the like can be determined without destroying the element, by observations using an optical means such as a microscope, for example, by observing how the solder wets the side surface of the substrate.

Additionally, the order of the steps described above may be altered.

Embodiments of a Hall element as an example of the magnetoelectric transducer of the present invention will be described below with reference to the drawings. However, the present invention is not limited to these embodiments.
(Embodiment 1)

Figure 1B:
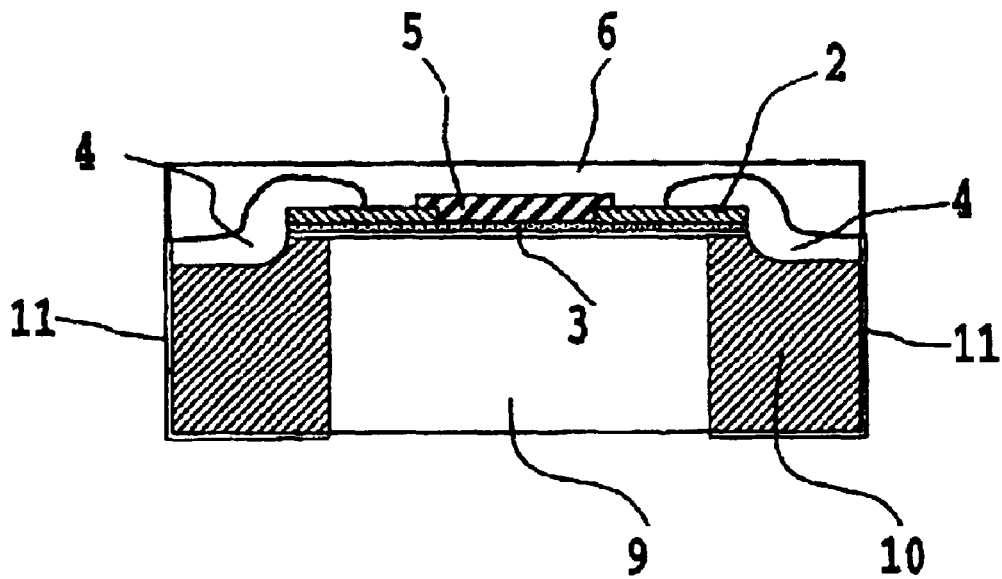

FIGS. 1A and 1B show schematic sectional views of an embodiment of a Hall element according to the present invention. In FIGS. 1A and 1B, reference numeral 9 denotes an alumina portion in which an insulating portion of an insulating substrate having a conductive layer formed in the thickness direction of the substrate is formed of a sintered compact. Reference numeral 10 denotes a sintered compact portion of a conductive layer composed of tungsten (W) or ceramic. The sintered compact 9 of the insulating layer and the sintered compact portion 10 of the conductive layer will be components of a metallized alumina substrate. Reference numeral 2 denotes an internal electrode of the magnetoelectric transducer which is composed of metal. Reference numeral 3 denotes a magnetosensitive section of the magnetoelectric transducer, 4 is a conductive resin layer formed on the internal electrode 2, 5 is a solder resist strain buffering layer covering the magnetosensitive section 3, 6 is an epoxy resin protective layer formed at least on the strain buffering layer 5 on the magnetosensitive section 3, and 11 is an Ni and Au plated portion formed on an external electrode.

FIG. 1A is a sectional view showing that the epoxy resin protective layer 6 is formed at least on the strain buffering layer 5 and part of the internal electrode 2. FIG. 1B is a sectional view showing that the epoxy resin protective layer 6 is formed all over the surface on which the magnetosensitive section is formed.

Figure 2A:
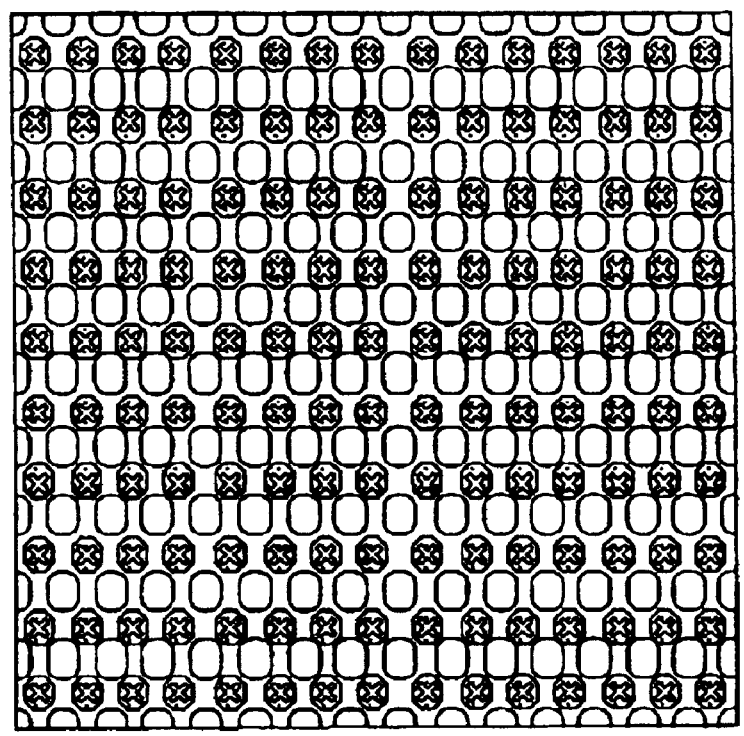
FIGS. 2A and 2B are process diagrams of a production method for the embodiment shown in FIGS. 1A and 1B, showing that a larger number of internal electrodes, magnetosensitive sections, and strain buffering layers are formed on a metallized alumina substrate.
Figure 2B:
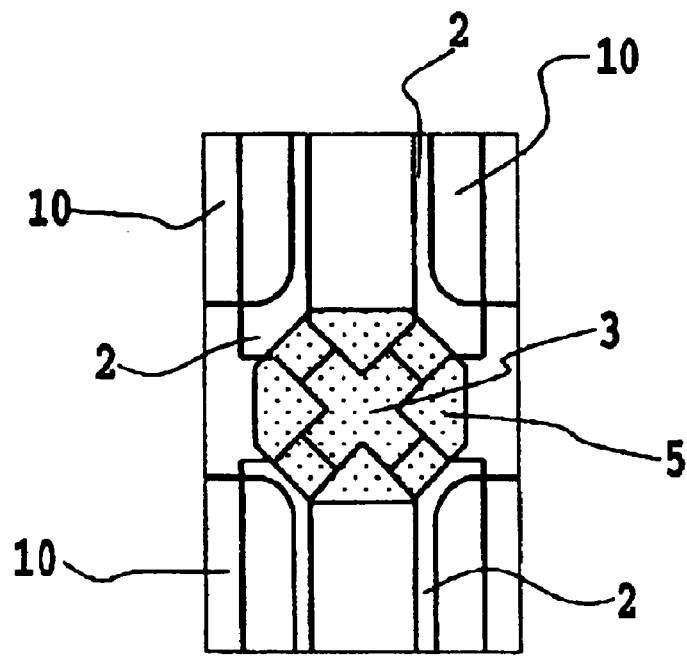

A process for producing a Hall element such as the one shown in FIGS. 1A and 1B will be described with reference to FIGS. 2B to 6. FIG. 2A shows that a pattern of a large number of magnetoelectric transducers is formed on the metallized alumina substrate 9 and 10. FIG. 2B is a partially enlarged view of FIG. 2A showing the arrangement of the internal electrode 2, magnetosensitive section 3, and strain buffering layer 5 of each magnetoelectric transducer and the conductive layer sintered compact portion 10 of the metallized alumina substrate. A wafer such as the one shown in FIGS. 2A and 2B was produced using the following process:

First, cleaved mica is provided as a deposition substrate. A thin In-excess InSb film was formed on the substrate by vapor deposition, and Sb, which forms a compound with the excess In in the InSb film, was excessively deposited thereon to form an thin InSb film of 0.7 µm thickness and 46,000 cm$^2$/V/sec. electron mobility. Then, a metallized alumina substrate of 54×54 mm size and 0.25 mm thickness was provided, and droplets of a polyimide resin were deposited on the thin InSb film. The metallized alumina substrate was placed thereon, a heavy stone was subsequently placed thereon, and the substrate was then left as it was at 200° C. for 12 hours. Then, the temperature was returned to the room temperature, and the mica was removed. Owing to height restrictions, the thickness of the resin for adhesion must be limited to several µm.

The sintered compacts of the conductive layers of the metallized alumina substrate are preferably arranged at such intervals that when the substrate is cut into individual magnetoelectric transducers in the final Hall element step, the sintered compacts of the conductive layers are arranged in the respective corners of the magnetoelectric transducer. A large number of sintered compacts of conductive layers were embedded in the alumina substrate in its thickness direction.

Figure 3:
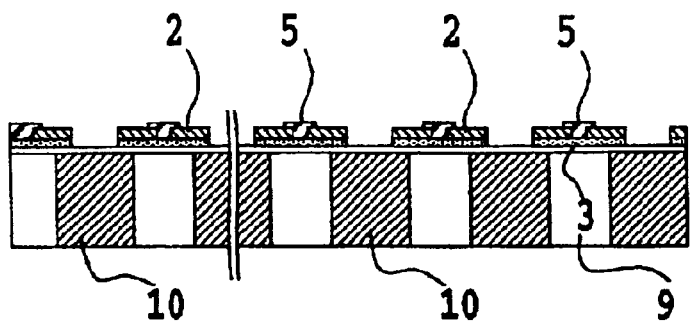
FIG. 3 is a process drawing of the production method for the embodiment shown in FIGS. 1A and 1B, which is a sectional view showing that the larger number of internal electrodes, magnetosensitive sections, and strain buffering layers are formed on the metallized alumina substrate.

So that the magnetosensitive section 3 was finally formed in the center of the sintered compact portions 10 of the conductive layers located in the four corners, an alignment step was executed on the basis of the appearance of the substrate or the pattern of the sintered compacts of the conductive layers of the metallized alumina substrate, and a Hall element pattern was formed by photolithography. Patterning was carried out for the internal electrodes, electroless copper plating was carried out, and copper electroplating was then carried out to define a thickness. Then, an etching pattern was formed, and the magnetosensitive section 3 and the internal electrodes 2 were formed by etching. The magnetosensitive section 3 had a length of 350 µm and a width of 170 µm. One pellet for each Hall element was 1.5×0.8 mm in size. Then, a solder resist 5 was formed on the surface on which the magnetosensitive section was formed. The solder resist was applied using a spin coater so as to have a thickness of 30 µm, and the predetermined portion of the solder resist was formed by a photolithography step. The solder resist was DSR-2200BGX, produced by Tamura Co., Ltd. This state is shown in FIG. 3.

Figure 4:
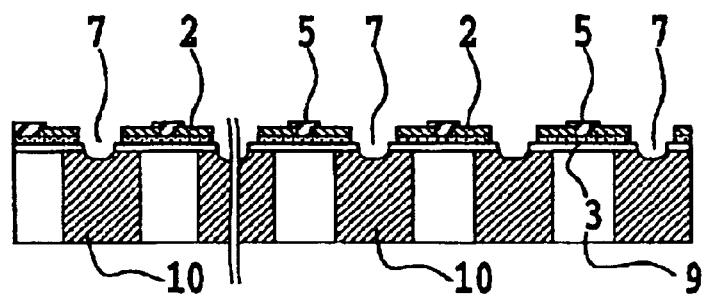
FIG. 4 is a process drawing of the production method for the embodiment shown in FIGS. 1A and 1B, showing that the substrate is cut so as to separate semiconductor devices from each other.

FIG. 4 shows that cuts 7 were made in the substrate so as to separate the semiconductor devices from each other. The substrate was cut using a blade of 0.3 mm width and a dicing saw. The cuts 7 were each about 30 μm in depth. The substrate was cut only in one direction (X direction) that would be the longitudinal direction of the final individual elements. The polyimide resin layer was broken to expose the sintered compacts of the conductive layers of the metallized alumina substrate.

Figure 5:
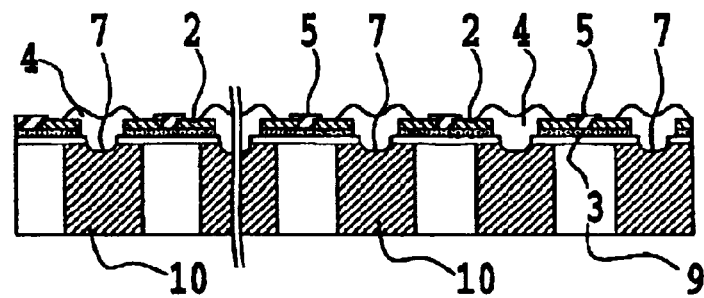
FIG. 5 is a process drawing of the production method for the embodiment shown in FIGS. 1A and 1B, showing that a conductive resin layer is formed on each internal electrode.

Then, a conductive resin layer 4 of 50 μm thickness was formed by screen printing so as to extend across the internal electrodes of the adjacent magnetoelectric transducer and to bury the cut 7. The conductive resin was LS-109 produced by Asahi Chemical Laboratory Co., Ltd. This state is shown in FIG. 5. Then, an epoxy resin protective layer of about 60 μm thickness was applied to and formed at least on the strain buffering layer on the magnetosensitive section. This state is shown in the sectional view in FIG. 6.

Figure 6:
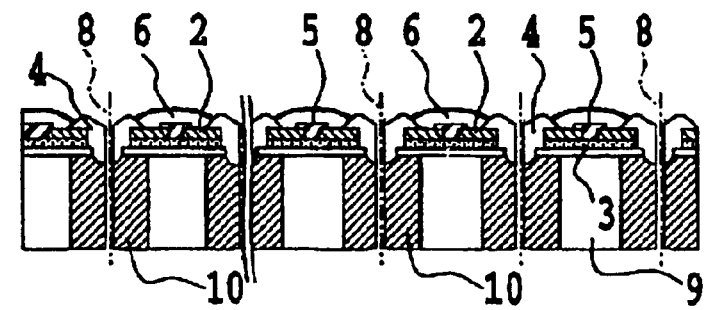
FIG. 6 is a process drawing of the production method for the embodiment shown in FIGS. 1A and 1B, showing that an epoxy resin protective layer is formed on the strain buffering layer and on part of each internal electrode and that the substrate is cut inupperieces.
Figure 7A:
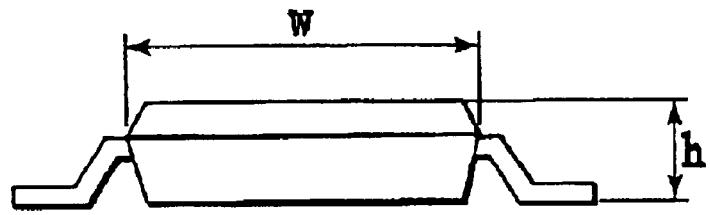
FIGS. 7A and 7B are diagrams showing the shape of a conventional Hall element.
Figure 7B:
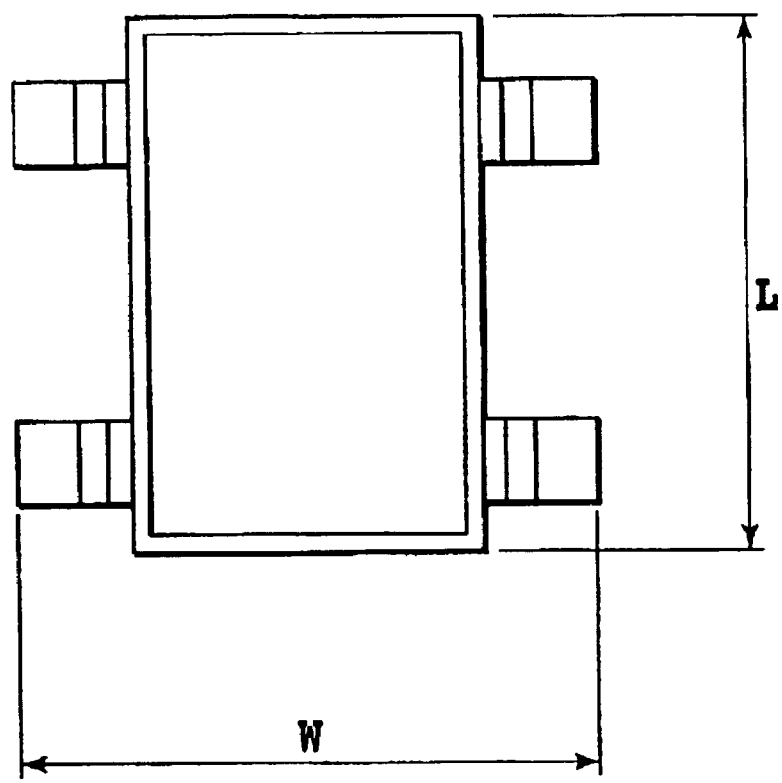

Then, a blade of 0.1 mm width and a dicing saw were used to cut the substrate in the X and Y directions along the cut lines 8 shown in FIG. 6 so as to separate it into individual Hall elements.

Finally, on the basis of barrel plating, the following parts were coated with a 3-μm Ni layer by electroless Ni plating and a 0.05-μm Au layer by electroless Au plating: part of the internal electrode which is not protected by the epoxy layer, the conductive resin portion, the sintered compact of the conductive layer on the side surface of a Hall element which is exposed by cutting with the dicing saw, and the sintered compact of the conductive layer on the back surface of the metallized alumina substrate.

The Hall element obtained in this manner is shown in FIGS. 1A and 1B. The Hall element according to this embodiment had a size of 0.8×1.5 mm (that is, the same as that of the element pellet) and a thickness of 0.35 mm. This element had a sensitivity of about 210 mV on the average at an input voltage of 1V and a magnetic flux density of 0.1T.

(Embodiment 2)

As in the case with Embodiment 1, the cuts 7 were made in the metallized alumina substrate, and the conductive resins 4 were formed.

Then, an epoxy resin protective layer was coated and formed all over the surface on which the magnetosensitive section was formed, so as to have a thickness of 60 μm. Then, as in the case with Embodiment 1, a Hall element was produced as shown in FIG. 1B. The element had substantially the same dimensions as the element of Embodiment 1 and exhibited a sensitivity similar to that of the latter.

(Embodiment 3)

A metallized alumina substrate carrying a thin semiconductor film was produced in the following manner: An $SiO_2$ layer of 5,000 Angstrom thickness was formed on one surface of a metallized alumina substrate of 54×54 mm size and 0.25 mm thickness. A thin InSb film of electron mobility 13,000 $cm^2$/V/sec. was formed directly on the $SiO_2$ layer by vapor deposition process similar to that in Embodiment 1.

Then, so that a magnetosensitive section was finally formed in the center of the sintered compact portions of the conductive layers located in the four corners, an alignment step was executed on the basis of the appearance of the substrate or the pattern of the sintered compacts of the conductive layers of the metallized alumina substrate, and a Hall element pattern was formed by photolithography and etching. Then, the $SiO_2$ layer located immediately above the sintered compact of the conductive layer was etched off by photolithography using ammonium fluoride. Patterning was carried out for the internal electrodes, and an EB deposition lift-off process was carried out to form a Cr layer of 1.0 μm thickness on part of the Hall element pattern and on the sintered compact portion of the conductive layer exposed by etching and so as to electrically connect the Hall element pattern and the sintered compacts of the conductive layers together. Subsequently, mask EB deposition was carried out to form an alumina layer was formed on the magnetosensitive section and on part of the internal electrode formed by the lift-off process.

Then, an epoxy resin protective layer of about 60 μm thickness was coated and formed by screen printing so as to cover the alumina layer. Subsequently, a Hall element was produced as in the case with Embodiment 1. This element had substantially the same dimensions as the element of Embodiment 1 and exhibited a sensitivity of about 60 mV on the average at an input voltage of 1V and a magnetic flux density of 0.1T.

(Embodiment 4)

A metallized alumina substrate carrying a thin semiconductor film was produced in the following manner: A mask composed of Mo and covering each conductive-layer sintered compact was set on one surface of a metallized alumina substrate of 54×54 mm size and 0.25 mm thickness to form an alumina layer of 5,000 Angstrom thereon. This method eliminated the need to form an insulating layer on each conductive-layer sintered compact. A thin InSb film of electron mobility 13,000 $cm^2$/V/sec. was formed directly on the alumina layer by vapor deposition process similar to that in Embodiment 1.

Then, so that a magnetosensitive section was finally formed in the center of the sintered compact portions of the conductive layers located in the four corners, an alignment step was executed on the basis of the appearance of the substrate or the pattern of the sintered compacts of the conductive layers of the metallized alumina substrate, and a Hall element pattern was formed by photolithography and etching.

Next, patterning was carried out for the internal electrodes, and an EB deposition lift-off process was carried out to form a Cr layer of 1.0 μm thickness on part of the Hall element pattern and on the sintered compact portion of the conductive layer which has been masked to avoid forming an insulating layer thereon and so as to electrically connect the Hall element pattern and the sintered compacts of the conductive layers together. Subsequently, mask EB deposition was carried out to form an alumina layer on the magnetosensitive section and on part of the internal electrode formed by the lift-off process.

Then, an epoxy resin protective layer of about 60 μm thickness was coated and formed by screen printing so as to cover the alumina layer. Subsequently, a Hall element was produced as in the case with Embodiment 1. This element had substantially the same dimensions as the element of Embodiment 1 and exhibited a sensitivity similar to that in Embodiment 3.

INDUSTRIAL APPLICABILITY

As described above, according to the present invention, magnetosensitive sections and internal electrode portions are formed on the upper surface of an insulating substrate having insulating layers formed in the thickness direction thereof. The insulating portion and each conductive layer are formed of a sintered compact. The sintered compact of the conductive layer is mainly composed of metal with a high melting point of 1,600° C. or higher and ceramic powders. The sintered compact of the conductive layer contains 10% or more and 90% or less of the high-melting-point metal.

Therefore, a very-small-sized and thin pellet-sized magnetoelectric transducer can be provided which allows its acceptability to be determined after mounting nondestructively and which allows magnetoelectric transducers to be easily formed.

What is claimed is:

1. A magnetoelectric transducer characterized in that the transducer comprises a magnetosensitive section and internal electrodes formed on an upper surface of insulating substrate having conductive layers formed on side surfaces thereof, that an insulating portion and each of said conductive layers are formed of a sintered compact, that the sintered compact of said conductive layer is mainly included of metal of a high melting point of 1,600° C. or higher and ceramic powders, and that the sintered compact of said conductive layer contains 10% to 90% of the high-melting point metal.

2. The magnetoelectric transducer according to claim 1, characterized in that the high-melting-point metal is W, Mo, Ta, or a mixture thereof, and the sintered compact of the insulating layer is a substrate composed of alumina.

3. The magnetoelectric transducer according to claim 1, characterized in that an adhesive resin layer or an inorganic layer is formed on a upper surface of said insulating substrate, and the magnetosensitive layer and each of the internal electrodes are formed thereon.

4. The magnetoelectric transducer according to claim 3, characterized in that the sintered compact of said conductive layer and each internal electrode, separated from each other at least via a step of said adhesive resin layer or said inorganic layer, are electrically connected together using a conductive resin or a metal material.

5. The magnetoelectric transducer according to claim 1, characterized in that an inorganic layer is formed on the upper surface of said insulating substrate, and an InSb-based thin film having an electron mobility of $10,000 cm^2 N/sec.$ or more is formed on the inorganic layer.

6. The magnetoelectric transducer according to claim 5, characterized in that said inorganic layer is made of silica, alumina, or glass.

7. The magnetoelectric transducer according to claim 1, characterized in that a resin layer is formed on the upper surface of said insulating substrate, and an InSb-based thin film having an electron mobility of $20,000 cm^2 N/sec.$ or more is formed on the resin layer.

8. The magnetoelectric transducer according to claim 1, characterized in that a metal coat is formed at least on a surface of the sintered compact of said conductive layer.

9. The magnetoelectric transducer according to claim 1, characterized in that a strain buffering layer is formed on said magnetosensitive section, and a protective film is formed thereon.

* * * * *